(12) United States Patent
Chien

(10) Patent No.: US 6,924,704 B2
(45) Date of Patent: Aug. 2, 2005

(54) CHARGE PUMP FOR PHASE-LOCKED LOOP

(75) Inventor: Hwey-Ching Chien, San Diego, CA (US)

(73) Assignee: Procomm, Inc., Hsinchu (TW)

( * ) Notice: Subject to any disclaimer, the term of this patent is extended or adjusted under 35 U.S.C. 154(b) by 119 days.

(21) Appl. No.: 10/688,476

(22) Filed: Oct. 20, 2003

(65) Prior Publication Data

US 2005/0083136 A1 Apr. 21, 2005

(51) Int. Cl.[7] .......................... H03D 13/00; H03L 7/089
(52) U.S. Cl. ............................ 331/1 A; 331/25; 327/12
(58) Field of Search ............................. 331/1 A, 8, 17, 331/25; 327/12

(56) References Cited

U.S. PATENT DOCUMENTS 6,192,094 B1 * 2/2001 Herrmann et al. .......... 375/375

* cited by examiner

Primary Examiner—David Mis
(74) Attorney, Agent, or Firm—H. C. Lin

(57) ABSTRACT

When both the sourcing command and the sinking command to the phase comparator are high, the charge pump phase detector creates a high impedance output dead period, which is undesirable. The dead zone can be minimized by resetting the phase comparator when both sourcing command and sinking command are high. Accurate timing of the reset signal is crucial to good PLL phase noise performance and also to the elimination of the dead zone problem. In our invention, accurate reset timing is achieved by including the charge pump delay time caused by the input gate capacitance of the output complementary MOSFETs in the reset signal path.

9 Claims, 5 Drawing Sheets

CHARGE PUMP FOR PHASE-LOCKED LOOP

BACKGROUND OF THE INVENTION (1) Field of the Invention

This invention relates to phase detector in a phase-locked loop, in particular to the charge pump of the phase comparator.

(2) Brief Description of Related Art

FIG. 1 shows a commonly used basic phase-locked loop (PLL) for a frequency synthesizer. A voltage controlled oscillator (VCO) generates a frequency to compare with a reference frequency in a phase comparator. The output of the phase comparator is used to feed a phase detector. In frequency synthesizers, a widely used method for phase detection is to use a charge pump after a phase comparator to derive a DC voltage for controlling the voltage-controlled oscillator (VCO). The charge pump charges a capacitor when the phase comparator output is UP, and discharges the capacitor when the phase comparator output is DOWN. The DC voltage changes the frequency of the VCO until the VCO generates a frequency, which is locked in phase with a reference frequency. The type of phase detector used in the design is known as "Three-state Phase Detector". The three states of the output are: "high", "low" and "high impedance". In this type of phase detector, when both outputs of the phase comparator are "high", the comparator resets both of its outputs to "low" state and turns off the sourcing and sinking currents of the charge pump. When this happens, the output of the charge pump is in the so-called "high impedance state". The loop filter in the frequency synthesizer is charged or discharged by the charge pump to increase or decrease the control voltage for the VCO. The design has two problems: First, the VCO can change phase without producing a significant phase comparator output to activate the charging and discharging mechanism. Second, there is a time delay between the time phase comparator sending an output signal and the time the charge pump completely respond to the signal and turn on or off the output currents accordingly. Conventional design is to add a delay to the reset signal, but the added delay cannot track with the charge pump, thus causing the phase detector to reset the charge pump to the high impedance state too soon or too late. If resetting the charge pump too soon, a phenomenon known as "dead band" (or "dead zone") will occur. Such an arrangement can have a dead band range in which the VCO can change phase without producing a significant phase comparator output to activate the charging and discharging mechanism. Then the VCO can fluctuate within the dead band and reduce the spectral purity of the oscillator. If resetting the charge pump too late then both the sourcing and sinking currents will exist for an excessively long time and produce no useful output current. This is because the "net" charge pump current depends on the matching of sourcing and sinking currents. For an ideal charge pump, the sourcing and sinking currents mismatch is zero percent which implies the charge pump generates no output current when both the sourcing and sinking currents are conducting at full swings. Under such situation, the thermal and shot noises generated in the sourcing and sinking devices in the charge pump will increase the VCO phase noise.

FIG. 2 shows a prior art charge pump phase detector block diagram. When the sourcing input signals $V_{source}$ is high and the sinking signal $V_{sink}$ is low, the output signal S1 at Q of flip-flop F1 fed from $V_{source}$ is up, causing the output of the inverter INV1 to go low, turning on the p-channel output MOSFET M3 toggle switch and pulling up the output capacitor (not shown). Conversely, when the input signal $V_{source}$ is high, the output signal S2 at Q of flip-lop F2 goes high, causing the output of inverter INV3 to be low, the output of the inverter INV4 to be high, turning on the n-channel MOSFET M1 of the complementary toggle switch and pulling down the output capacitor. When both the UP signal S1at the output of flip-flop F1 and the DOWN signal S2 at the output of flip-flop F2 are high, a RESET signal is generated by an AND gate AND1 with inputs from S1, S2 and an output fed through a chain of inverters 13 to reset the flip-flop F1 and flip-flop F2 to set both Q outputs to be low, thereby turning off both M1 and M3 to set the output of the charge pump at the high impedance state. The function of the delay chain of inverters 13 is to compensate for the delays in the output MOSFETs M1 and M3, so that the output of the charge pump is not untimely turned off. However, since the delay chain does not track the "real" delay in the charge, the reset signal may by too early or too late. If the reset signal comes out too early, the charge pump shuts down (i.e. in the high impedance state) before the sourcing or sinking current reach its desired DC current levels. If this happens, the charge performs poorly and the phase-locked loop may degrade its performance or cause instability. If the reset signal appears too late, the can be a significantly long period of time that both the sourcing and sinking currents exist. If this happens, the sourcing and sinking currents cancel each other and result in nearly "zero" charge output current and degrade the PLL performance. In this FIG. 2, the inverter INV1 is used to invert the S1 signal for driving the PMOS M3. The inverters INV3 and INV4 are used to introduce some delay for S2 signal to drive the faster NMOS M1.

SUMMARY

An object of this invention is to minimize the effect of the dead band in a charge pump of a phase detector in a phase locked loop. Another object of this invention is to minimize the dithering in charge pump of a phase detector (i.e., to reduce the phase noise or jitter in the charge pump). Still another object of this invention is to balance the delays of the p-channel and n-channel MOSFET which provide the charging and discharging output currents.

These objects are achieved in this invention by deriving a reset signal from the input signal to the charge pump output current source or sink which drives the loop filter. Thus the charge pump delay is included in the reset path. The timing of reset signal automatically coincides with the state of the charge pump output.

BRIEF DESCRIPTION OF THE INVENTION

DETAILED DESCRIPTION OF THE PRESENT INVENTION

Figure 1:
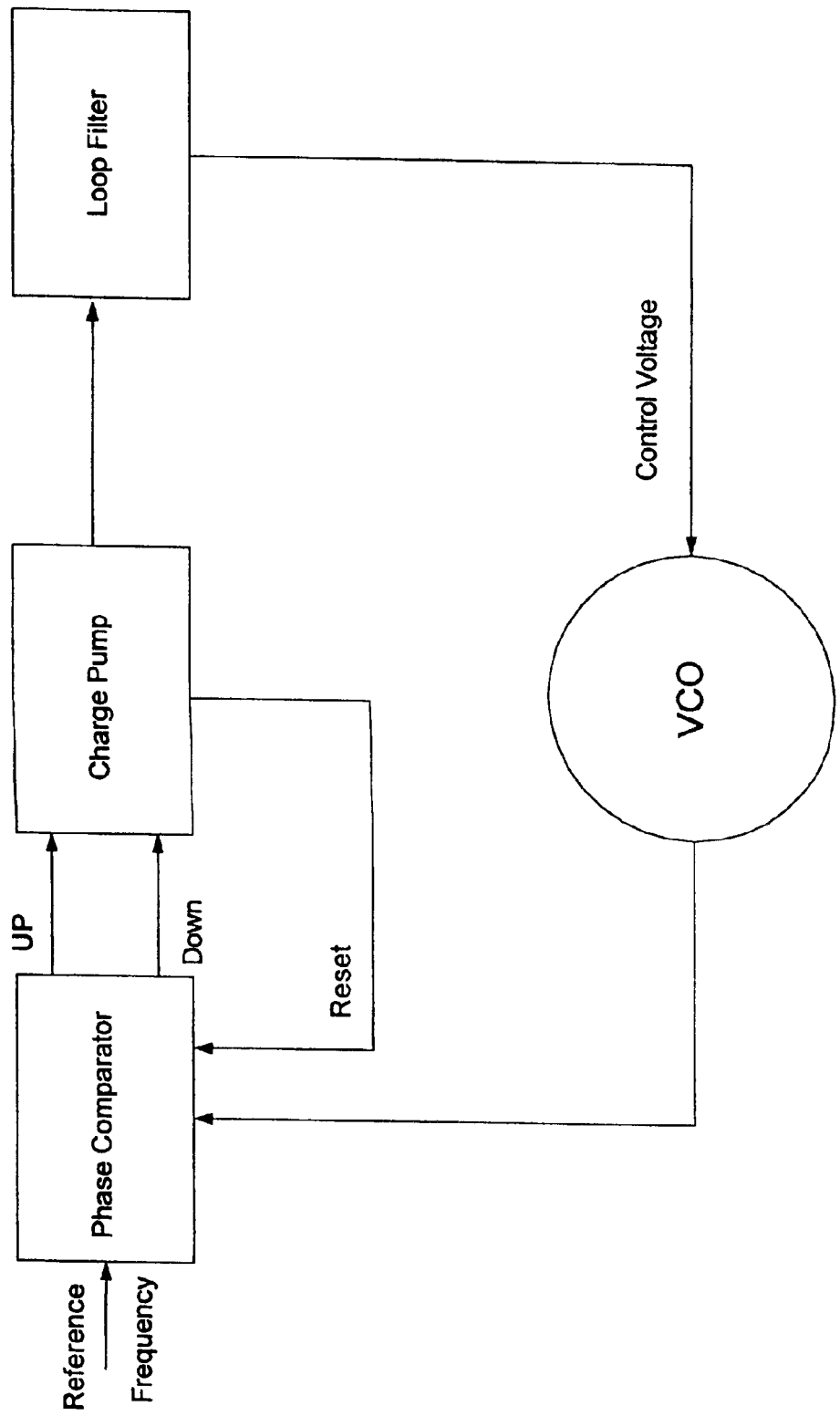
FIG. 1 shows a block diagram of a phase locked loop of a frequency synthesizer.
Figure 2:
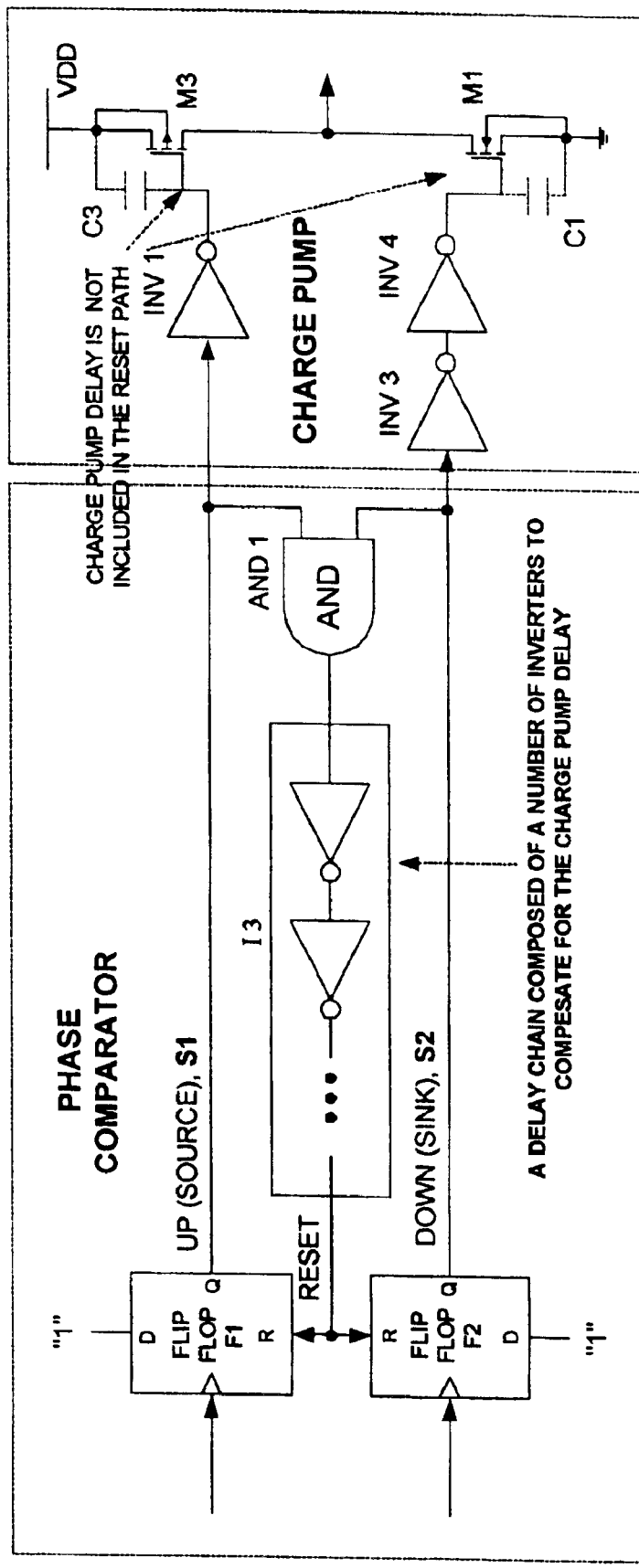
FIG. 2 shows block diagram of a prior art charge pump driven from a phase comparator.
Figure 3:
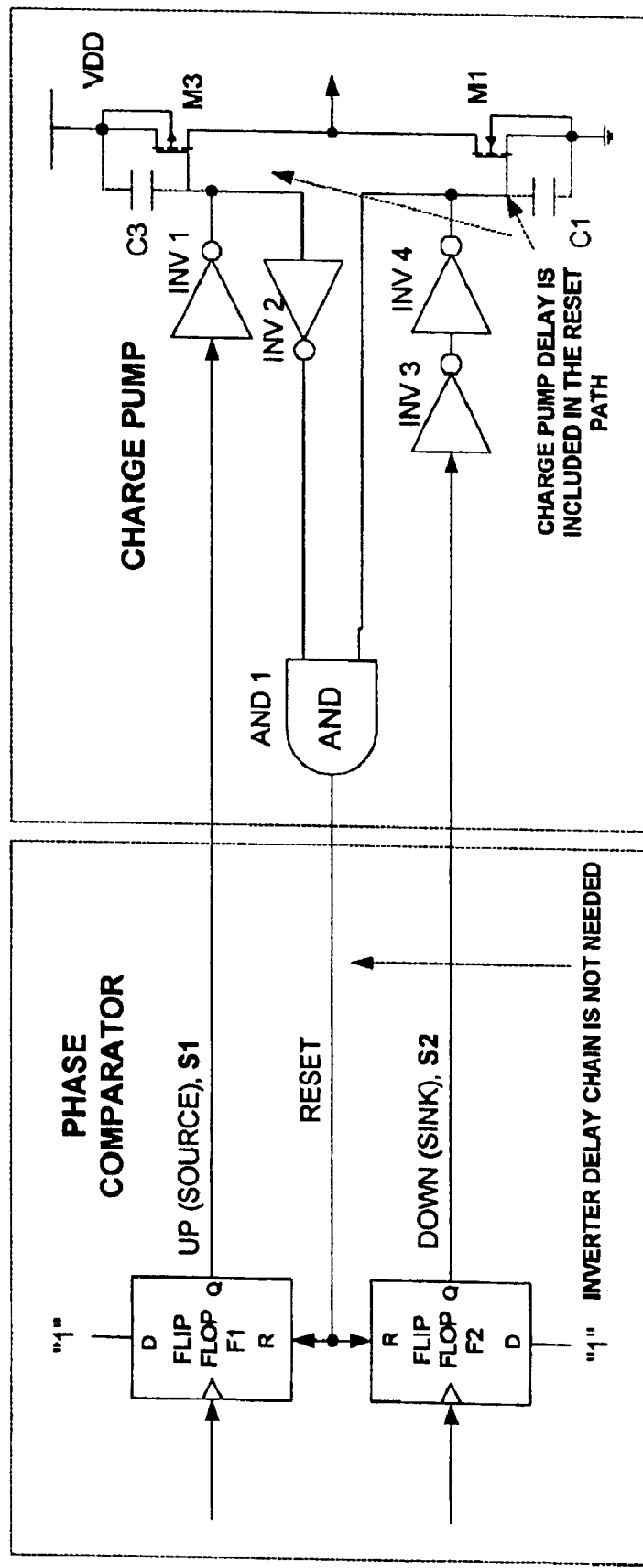
FIG. 3 shows the basic block diagram of the charge pump of the present invention.

FIG. 3 shows the block diagram of the present invention. The block diagram is similar to the prior art FIG. 2. Same reference numerals correspond to the same functions as that in FIG. 2. The differences are: (1) the RESET signal is derived from the gate inputs to the complementary charge pump output switches M1 and M3 through AND gate AND1, and (2) the delay chain of inverters I3 in FIG. 2 is eliminated, and (3) an inverter INV2 is inserted between the input to the gate of M3 and the upper input to the AND gate. In this design, the reset path includes the delay of the charge pump. By doing so, even with process variation or temperature effects, the reset signal is never too early or too late and the phase comparator and the charge pump work coordinately.

Figure 4:
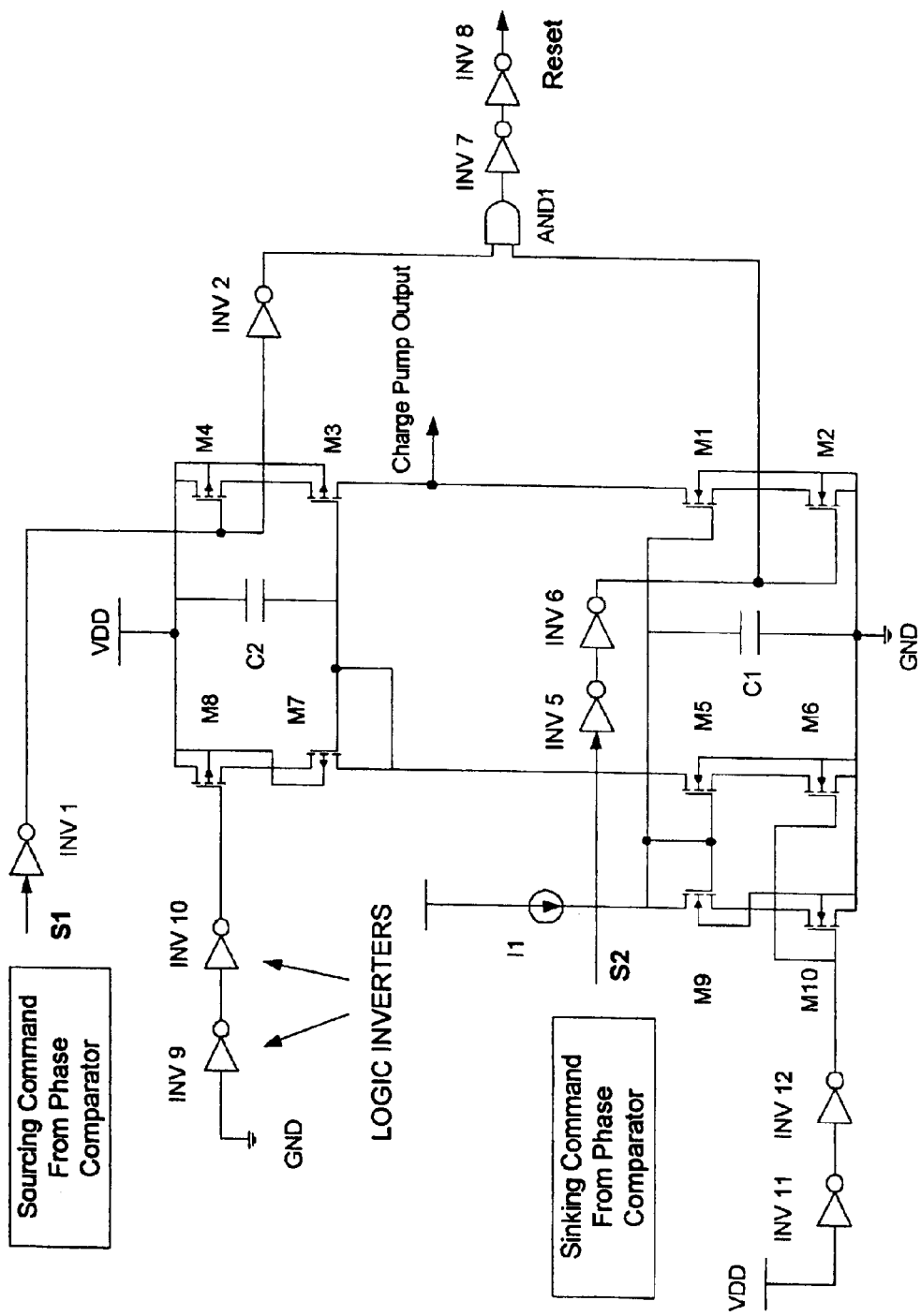
FIG. 4 shows a first embodiment of the circuit to implement the present invention.

FIG. 4 shows a first embodiment of the present invention. M1(NMOS) and M3 (PMOS) compose of the output charge pump stage. M3 sources current to the charge pump output and M1 sinks the current from the output. M1 and M3 are usually long channel MOSFETs to avoid the short channel effect and achieve better current matching. M2 and M4 are short-channel switches, The gates of M1 and M3 are constantly biased. The sourcing command signal S1 (high active) turns on or off M4. The sinking command signal S2 (also high active) turns on or M2. When M2 turns on, M1 conducts and generates sinking current; when M4 turns on, M3 conducts and generates sourcing current. Current sources (M5, M7, M9) and switches (M6, M8, M10) are always turned on except when the current source 11 is turned off. When both S1 and S2 are high, a reset signal is sent to the phase comparator and consequently shut down both M3 and M1.

The device sizes of M9 and M5 are the same (or with a ratio), and the device sizes of M10 and M6 are the same (or with a same ratio as M9 to M5). The device size ratio of M3 to M7, M4 to M8, M1 to M5, M2 to M6 are the same to have matched sourcing and sinking currents. INV1 and INV10 are identical inverters and so are INV6 and INV12. Capacitors C1 and C2 are used to filter out switch feedthrough signals and achieve stable bias voltage and to reduce noises from the current sources (i.e C2 reduces noises from M7 and M8 and C1 reduces noises from I1, M9, M10, M5 and M6).

It is to be noted that INV1, M4 and INV2 in the sourcing command path and INV5, INV6, M2 in the sinking command path are designed in the way that the delay time from S1 to the AND gate AND1 and the delay time from S2 to AND1 are the same.

Another feature is that the gate of M8 is not connected to ground GND directly but through INV9 and INV10. Since INV10 and INV1 are identical in size, the gate bias voltages of M8 and M4 (when fully turned on) are the same so the currents in M4 will track the current in M8 over process variation and temperature (the size ratios of M4 to M8 and M3 to M7 are the same and designed to achieve the desired current). Similarly, the gates of M10 and M6 are not tied to VDD directly but through INV11 and INV12. Since INV12 and INV6 are identical, the currents in M1 and M5 will track the current in M9 over process variation and temperature.

Figure 5:
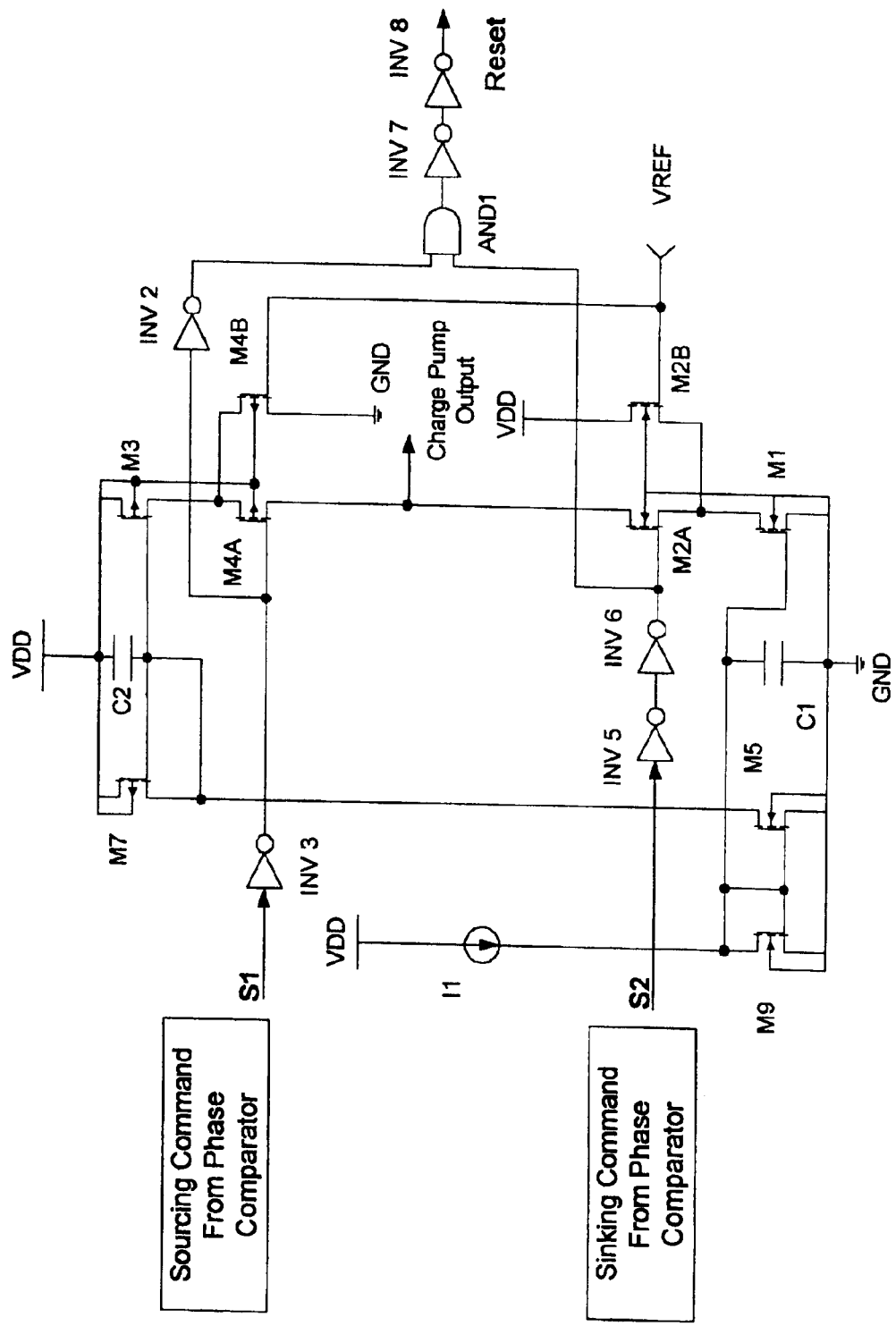
FIG. 5 shows a second embodiment of the circuit to implement the present invention.

FIG. 5 shows another embodiment of the present invention. The circuit is the similar to FIG. 4 except that: (1) the cascode current mirrors M7, M8 and M9, M10 in FIG. 4 are changed to basic current mirrors M7 and M9, respectively; (2) the simple switches M4 and M2 in FIG. 4 are now changed to current switches M4A, M4B and M2A, M2B, respectively. It is well known that current switches are faster than simple switches. Other than these exceptions, same reference numerals in FIG. 5 correspond to the same functional parts in FIG. 4.

While particular embodiments of the inventions has been described, it will be apparent to those skilled in the art that various modifications may be made in the embodiment without departing from the spirit of the present invention. Such modifications are all within the scope of this invention.

What is claimed is:

1. A phase detector for a phase locked loop to derive a control voltage for a voltage controlled oscillator VCO, comprising:

a charge pump, having complementary PMOS and NMOS switches, to charge a storage capacitor for deriving a control voltage for a VCO when said PMOS is on, and to discharge said capacitor when said NMOS is on;

a phase comparator for selectively generating a sourcing signal to turn on said PMOS and a sinking signal to turn on said NMOS;

a reset signal for inactivating said phase comparator when both sourcing signal and sinking signal are high, wherein said reset signal is derived from the gates of said PMOS and said NMOS switches through an AND gate.

2. The phase detector described in claim 1, wherein said sourcing signal is fed to the gate of said PMOS through a first inverter, and the gate of said PMOS is fed to said AND gate through a second inverter.

3. The phase detector as described in claim 1, further comprising a third inverter and a fourth inverter in series between said sinking signal and said AND gate to introduce a delay to the NMOS for compensating the intrinsic delay of said PMOS.

4. The phase detector as described in claim 1, wherein said PMOS and said NMOS switches are a PMOS cascode amplifier and an NMOS cascode amplifier.

5. The phase detector as described in claim 4, further comprising a fifth inverter and a sixth inverter in series between said sinking command and the input gate of said NMOS cascode amplifier.

6. The phase detector as described in claim 4, further comprising a first capacitor connected between a positive power supply and the gate of the output PMOS of said PMOS cascode amplifier, a second capacitor connected between a negative power supply and the gate of the output NMOS of said NMOS cascode amplifier.

7. The phase detector as described in claim 1, further comprising a seventh inverter and an eighth inverter in series between said AND gate and said phase comparator.

8. The phase detector as described in claim 4, further comprising a ninth converter and a tenth converter in series with a negative reference voltage of the PMOS cascode amplifier, and an eleventh converter and twelfth converter in series with the positive reference voltage of the NMOS cascode amplifier.

9. The phase detector as described in claim 4, wherein the input switches of the PMOS cascode amplifier and the NMOS cascode amplifier are current switches.

* * * * *